US009673086B2

(12) United States Patent
Yokokawa et al.

(10) Patent No.: US 9,673,086 B2
(45) Date of Patent: Jun. 6, 2017

(54) METHOD OF PRODUCING BONDED WAFER

(71) Applicant: SHIN-ETSU HANDOTAI CO., LTD., Tokyo (JP)

(72) Inventors: Isao Yokokawa, Takasaki (JP); Masahiro Kato, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/910,080

(22) PCT Filed: Jul. 15, 2014

(86) PCT No.: PCT/JP2014/003729
§ 371 (c)(1),
(2) Date: Feb. 4, 2016

(87) PCT Pub. No.: WO2015/025462
PCT Pub. Date: Feb. 26, 2015

(65) Prior Publication Data
US 2016/0197007 A1    Jul. 7, 2016

(30) Foreign Application Priority Data
Aug. 21, 2013  (JP) ................. 2013-171167

(51) Int. Cl.
H01L 21/762    (2006.01)
H01L 21/02     (2006.01)

(52) U.S. Cl.
CPC ............. H01L 21/76254 (2013.01)

(58) Field of Classification Search
CPC ....... H01L 21/02; H01L 21/762; H01L 21/74; H01L 21/033; H01L 21/761;
(Continued)

(56) References Cited

U.S. PATENT DOCUMENTS 5,042,952 A    8/1991  Opsal et al.
5,374,564 A    12/1994 Bruel
(Continued)

FOREIGN PATENT DOCUMENTS

JP    S61-223543 A    10/1986
JP    H05-211128 A    8/1993
(Continued)

OTHER PUBLICATIONS

Oct. 28, 2014 Search Report issued in International Patent Application No. PCT/JP2014/003729.
(Continued)

Primary Examiner — Chuong A Luu
(74) Attorney, Agent, or Firm — Oliff PLC

(57) ABSTRACT

A method of producing a bonded wafer in which wafers each having a cutout portion are used as a bond wafer and a base wafer, and either or both of settings of an ion implanter with which ions are implanted and conditions of the ion implantation are adjusted in the step of implanting the ions such that a cutout portion of either or both of the bond wafer and the base wafer after bonding is located at within a range of 0±30° or 180±30° from a position at which separation of the bond wafer begins in the step of separating the bond wafer. This method can inhibit the occurrence of large fault defect that may be generated on a surface of a thin film right after the separation, when a thin film such as an SOI layer is formed by the ion implantation separation method.

20 Claims, 5 Drawing Sheets

(58) Field of Classification Search
CPC ..... H01L 21/763; H01L 21/187; H01L 21/32; H01L 21/02255; H01L 21/02238; H01L 21/76202; H01L 21/76254; H01L 21/76264; H01L 21/76275; H01L 21/76251; H01L 21/2007
USPC .......................... 438/458, 406, 418, 419, 420
See application file for complete search history.

(56) References Cited

U.S. PATENT DOCUMENTS

| | | |
|---|---|---|
| 6,335,535 B1 | 1/2002 | Miyake et al. |
| 2008/0299742 A1 | 12/2008 | Akiyama et al. |
| 2009/0117711 A1 | 5/2009 | Harle et al. |
| 2010/0025804 A1 | 2/2010 | Kawai et al. |
| 2010/0176493 A1 | 7/2010 | Mohamed et al. |
| 2014/0097523 A1 | 4/2014 | Aga et al. |
| 2015/0044798 A1* | 2/2015 | Hertkorn ........... H01L 21/76254 438/33 |
| 2015/0118825 A1* | 4/2015 | Ishizuka ........... H01J 37/32412 438/458 |

FOREIGN PATENT DOCUMENTS

| | | |
|---|---|---|
| JP | H09-246505 A | 9/1997 |
| JP | 2003-347176 A | 12/2003 |
| JP | 2007-173354 A | 7/2007 |
| JP | 2008-277501 A | 11/2008 |
| JP | 2009-170652 A | 7/2009 |
| JP | 2012-248739 A | 12/2012 |

OTHER PUBLICATIONS

Sep. 5, 2016 Office Action issued in Taiwanese Application No. 103124943.
Feb. 24, 2017 Search Report issued in European Patent Application No. 14838255.9.

* cited by examiner

HIGH TEMPERATURE SIDE
(LIGHT COLOR)

LOW TEMPERATURE SIDE
(DEEP COLOR)

ENLARGED
FRAGMENTARY VIEW

METHOD OF PRODUCING BONDED WAFER

TECHNICAL FIELD

The present invention relates to a method of producing a bonded wafer by using an ion implantation separation method, and typically to a method of producing a bonded wafer by bringing a silicon wafer in which ions such as hydrogen ions are implanted into close contact with a support wafer and then performing a heat treatment on these wafers to separate the silicon wafer.

BACKGROUND ART

A method of producing SOI wafers by separating ions-implanted wafers after bonding, i.e., the ion implantation separation method (an art also referred to as the Smart Cut method (registered trademark)), has attracted attention as a method for producing SOI wafers.

In this method, for example, an oxide film is formed on at least one of two silicon wafers, and gas ions, such as hydrogen ions or rare gas ions, are implanted from a front surface of one of the silicon wafers (a bond wafer) to form a layer of the implanted ions (also referred to as a micro bubble layer) in the interior of the wafer.

The oxide film is then interposed between the surface from which the ions have been implanted and the other silicon wafer (a base wafer) so that these wafers are bonded. These wafers after bonding are then subjected to a heat treatment in which the wafers are left in a heat treatment furnace at a given temperature for a prescribed time after the temperature was increased at a rate of about 10° C. per minute, so that the bond wafer is cleaved along the layer of the implanted ions, whereby a bonded wafer is formed. A heat treatment (a bonding heat treatment) is then performed on this bonded wafer at a high temperature to strengthen a bond between the base wafer and an SOI layer separated from the bond wafer. In this way, an SOI wafer is obtained (See Patent Document 1, for example).

In production of a bonded wafer by the ion implantation separation method, the bond wafer used to form a thin film usually has the same plane orientation as the base wafer used as a support substrate. Wafers having a cutout portion such as a notch or orientation flat that shows the plane orientation at the same position are used to form the SOI wafer by bonding through the oxide film or a directly bonded wafer by bonding without an oxide film.

The bond wafer and the base wafer are usually bonded at room temperature such that the cutout portion of these wafers is aligned, and the resultant wafers are then subjected to a separation heat treatment to separate the bond wafer along the layer of the implanted ions, whereby the bonded wafer is produced.

CITATION LIST

Patent Literature

Patent Document 1: Japanese Unexamined Patent publication (Kokai) No. H05-211128

SUMMARY OF INVENTION

Technical Problem

The separation heat treatment begins the separation along the layer of the implanted ions at a separation start position and gradually advances the separation. If a variation in shape such as a notch is involved halfway during the separation, however, the speed of the advancement of the separation changes at the position of this variation, and a fault-like defect (referred to as a large fault defect below) that looks like a scratch extending to a comparatively wide range is generated on the thin film.

The present invention was accomplished in view of the above problem. It is an object of the present invention to provide a method of producing a bonded wafer that can inhibit the occurrence of the large fault defect that may be generated on the surface of the thin film right after the separation, when the thin film such as the SOI layer is formed by the ion implantation separation method.

Solution to Problem

To solve the problem, the present invention provides a method of producing a bonded wafer, comprising: implanting hydrogen ions, rare gas ions, or mixed gas ions thereof into a bond wafer from a surface of the bond wafer to form a layer of the implanted ions in an interior of the bond wafer; bonding the surface from which the ions are implanted into the bond wafer and a surface of a base wafer; and then separating the bond wafer along the layer of the implanted ions by performing a separation heat treatment on the wafers after the bonding step by using a heat treatment furnace such that the bonded wafer is formed, wherein wafers each having a cutout portion are used as the bond wafer and the base wafer, and either or both of settings of an ion implanter with which the ions are implanted and conditions of the ion implantation are adjusted in the step of implanting the ions such that the cutout portion of either or both of the bond wafer and the base wafer after the bonding step is located at within a range of 0±30° or 180±30° from a position at which the separation of the bond wafer begins in the step of separating the bond wafer.

Such a method of producing a bonded wafer can intentionally set the separation start position when the ions are implanted into the bond wafer and arrange the bond wafer and the base wafer after bonding such that the cutout portion of either or both of these wafers is located at within a range of 0±30° or 180±30° from the separation start position of the bond wafer, thereby avoiding the involvement of the cutout portion in the course of the separation during the separation process and enabling the inhibition of the occurrence of the large fault defect.

The step of implanting the ions preferably includes arranging the bond wafer in the ion implanter such that a position of the cutout portion of the bond wafer or a position of 180° away from the cutout portion of the bond wafer matches a position at which damage due to the ion implantation is comparatively large in a plane of the bond wafer, the damage being determined by the ion implanter and the conditions of the ion implantation.

This arrangement to the position at which the damage due to the ion implantation is comparatively large in a plane of the bond wafer enables the separation to begin at the position of the cutout portion of the bond wafer or the position of 180° away from the cutout portion of the bond wafer.

In the step of implanting the ions, an amount of the implanted ions at the position of the cutout portion of the bond wafer or the position of 180° away from the cutout portion of the bond wafer is preferably larger than at other positions.

At the position at which the amount of the implanted ions is large, the separation is facilitated and proceeds by a heat treatment for a short time. Accordingly, implanting the ions at the position of the cutout portion of the bond wafer or the position of 180° away from the cutout portion of the bond wafer in a larger amount than at the other positions enables the separation to begin at the position of the cutout portion of the bond wafer or the position of 180° away from the cutout portion of the bond wafer.

The step of implanting the ions preferably includes arranging the bond wafer on a heat sink such that the position of the cutout portion of the bond wafer or the position of 180° away from the cutout portion of the bond wafer matches a position at which thermal conduction of the heat sink when the ions are implanted is comparatively poor in a plane of the bond wafer.

At the position at which the thermal conduction of the heat sink is poor, cooling efficiency is low and the temperature becomes high when the ions are implanted, resulting in greater damage due to the ion implantation. When the position of the cutout portion of the bond wafer or the position of 180° away from the cutout portion of the bond wafer matches the position at which the thermal conduction of the heat sink is comparatively poor in a plane of the bond wafer, this position can be matched to the position at which the damage due to the ion implantation is comparatively large in a plane of the bond wafer by making the temperature at this position comparatively high in a plane of the bond wafer during the ion implantation. This enables the separation to begin at the position of the cutout portion of the bond wafer or the position of 180° away from the cutout portion of the bond wafer.

Moreover, a portion of the heat sink at the position at which the thermal conduction of the heat sink is comparatively poor in a plane of the bond wafer is preferably made of a material having a lower thermal conductivity than at other portions.

In this manner, the heat sink can have a portion at which the thermal conduction is comparatively poor in a plane of the bond wafer.

The portion of the heat sink at the position at which the thermal conduction of the heat sink is comparatively poor in a plane of the bond wafer is preferably thicker than the other portions.

In this manner, the heat sink can have a portion at which the thermal conduction is comparatively poor in a plane of the bond wafer.

The step of performing the separation heat treatment preferably includes arranging the wafers after the bonding step in the heat treatment furnace such that the position of the cutout portion or the position of 180° away from the cutout portion of either or both of the bond wafer and the base wafer matches a position at which the wafers after the bonding step have a comparatively high temperature in their plane.

At the position at which the wafers after the bonding step have a comparatively high temperature in their plane, the separation is easy to proceed during the separation heat treatment. Accordingly, when the arrangement is done in the heat treatment furnace such that the position of the cutout portion or the position of 180° away from the cutout portion of either or both of the bond wafer and the base wafer matches the position at which the wafers after the bonding step have a comparatively high temperature in their plane, the separation can begin at the position of the cutout portion or the position of 180° away from the cutout portion of either or both of the bond wafer and the base wafer.

The cutout portion is preferably a notch.

The wafer having the notch facilitates the bonding process because the notch can be a positional reference when the wafers are bonded. In addition, a large diameter wafer that is mainly used recently has the notch, and the invention can be applied to the bonding process of such a large diameter wafers having the notch.

Advantageous Effects of Invention

Thus, the inventive method of producing a bonded wafer allows for intentional operation of the separation start position when the ions are implanted into the bond wafer, thereby avoiding the involvement of the cutout portion in the course of the separation during the separation process and enabling the inhibition of the occurrence of the large fault defect under the condition that the cutout portion of either or both of the bond wafer and the base wafer after bonding is located at within a range of 0±30° or 180±30° from the separation start position of the bond wafer. In addition, when the separation start position determined when the ions are implanted matches the position at which the wafers have a comparatively high temperature in their plane during the separation heat treatment, the separation start position can more reliably be a desired position.

DESCRIPTION OF EMBODIMENTS

There has been a need for development of a method of producing a bonded wafer that can inhibit the occurrence of large fault defect that may be generated on the surface of a thin film right after the separation process when the thin film such as the SOI layer is formed by the ion implantation separation method, as described above.

Figure 9:
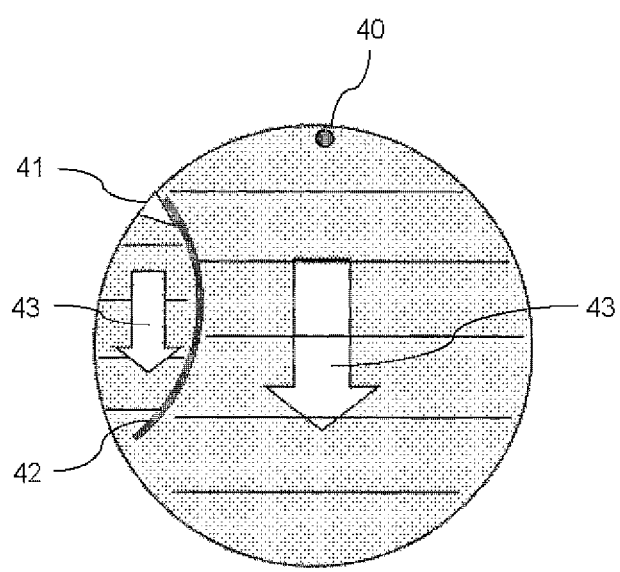
FIG. 9 is a schematic diagram of a mechanism of the occurrence of large fault defect.

FIG. 9 schematically shows a mechanism of the occurrence of large fault defect. The separation heat treatment begins the separation along the layer of the implanted ions at a separation start position 40 and gradually advances the separation. As shown in FIG. 9, however, it can be understood that if a variation in shape such as a notch 41 is involved halfway during the separation, then the speed of the advancement of the separation changes at the position of this variation, and a boundary line thereof becomes the large fault defect 42.

From this understanding, the inventors devised that when the bond wafer is separated, placement of its cutout portion at the separation start position or the position of 180° away from the separation start position enables the inhibition of the occurrence of large fault defect, because the cutout portion hardly affects the separation in the course of the separation process. In other words, intentional determination of the separation start position permits the cutout portion to prevent from being involved with the separation, resulting in the inhibition of the occurrence of large fault defect.

As disclosed in Japanese Unexamined Patent publication No. 2009-170652, the separation start position can be found by measurement of haze on the separation surface or distribution map of the film thickness of the thin film. These measurement revealed that the separation start position is apt to form at the position at which damage due to ion implantation is comparatively large in a plane of the bond wafer, or the position at which wafers after bonding have a comparatively high temperature in their plane during the separation heat treatment.

This damage due to ion implantation, which greatly affects the determination of the separation start position, will now be described.

When ions are implanted into a target semiconductor wafer, atoms that make up the target wafer collide with the implanted ions and are repelled. The damage is formed by defects generated by repelling the atoms of the target wafer.

Repelling an atom requires a collision energy equal to or higher than a bonding energy of the atom. This energy corresponds to an acceleration energy of an ion and a heat energy due to the temperature of the target wafer. The damage accordingly becomes large when an accelerating voltage and the temperature of the target wafer upon implanting are high. As the amount of implanted ions are larger, the number of repelled atoms increases, and the damage becomes larger.

An ion implanter provides very high uniformity in the depth direction of ion implantation by properly controlling the acceleration energy. Accordingly, damage distribution in a plane of the target wafer is hardly affected by variations in accelerating voltage but greatly affected by distribution of ion implanted amount and temperature in the plane of the wafer. The distribution of ion implanted amount is affected by how to move a beam and the wafer during the implantation, and variations in current of the beam. In the implantation process, the wafer is placed on a base called a heat sink. The distribution of in-plane temperature changes due to condition of contact between the back surface of the wafer and the heat sink, the flatness of the heat sink, the thickness of an intermediate material, such as a rubber material to increase a contact area, disposed between the heat sink and the back surface of the wafer, and variations in material properties of the intermediate material. More specifically, a reduction in radiant heat from the wafer back surface due to bad contact conditions of this surface increases the temperature at that position, thereby increasing the damage. In contrast, an increase in radiant heat from the wafer back surface due to good contact conditions of this surface decreases the temperature at that position, thereby reducing the damage. In addition, contact of the wafer with a pin to hold the wafer increases the cooling efficiency of the contact portion of the wafer with the pin, thereby reducing the damage.

From the above considerations, the inventors found the following. When the bond wafer is separated, the cutout portion of wafers after bonding is intentionally located at the separation start position or 180° C. rotationally away from the separation start position. This positioning prevents the cutout portion from being involved with the separation halfway during the separation process and can thereby inhibit the occurrence of large fault defect. The separation start position is greatly affected by the damage due to ion implantation into the bond wafer. In view of these, when ions are implanted, adjustment of settings of an ion implanter and conditions of ion implantation permit the separation start position to be identical to the above position by intention. The inventors thereby brought the invention to completion.

The invention provides a method of producing a bonded wafer, including: implanting hydrogen ions, rare gas ions, or mixed gas ions thereof into a bond wafer from a surface of the bond wafer to form a layer of the implanted ions in an interior of the bond wafer; bonding the surface from which the ions are implanted into the bond wafer and a surface of a base wafer; and then separating the bond wafer along the layer of the implanted ions by performing a separation heat treatment on the wafers after the bonding step by using a heat treatment furnace such that the bonded wafer is formed, wherein wafers each having a cutout portion are used as the bond wafer and the base wafer, and either or both of settings of an ion implanter with which the ions are implanted and conditions of the ion implantation are adjusted in the step of implanting the ions such that the cutout portion of either or both of the bond wafer and the base wafer after the bonding step is located at within a range of 0±30° or 180±30° from a position at which the separation of the bond wafer begins in the step of separating the bond wafer.

An embodiment of a method of producing a bonded wafer according to the invention will now be described in detail with reference to FIG. 1 by way of example of producing the bonded wafer by the ion implantation separation method, which is also referred to as the Smart Cut method (registered trademark). The invention however is not limited to this embodiment.

Figure 1:
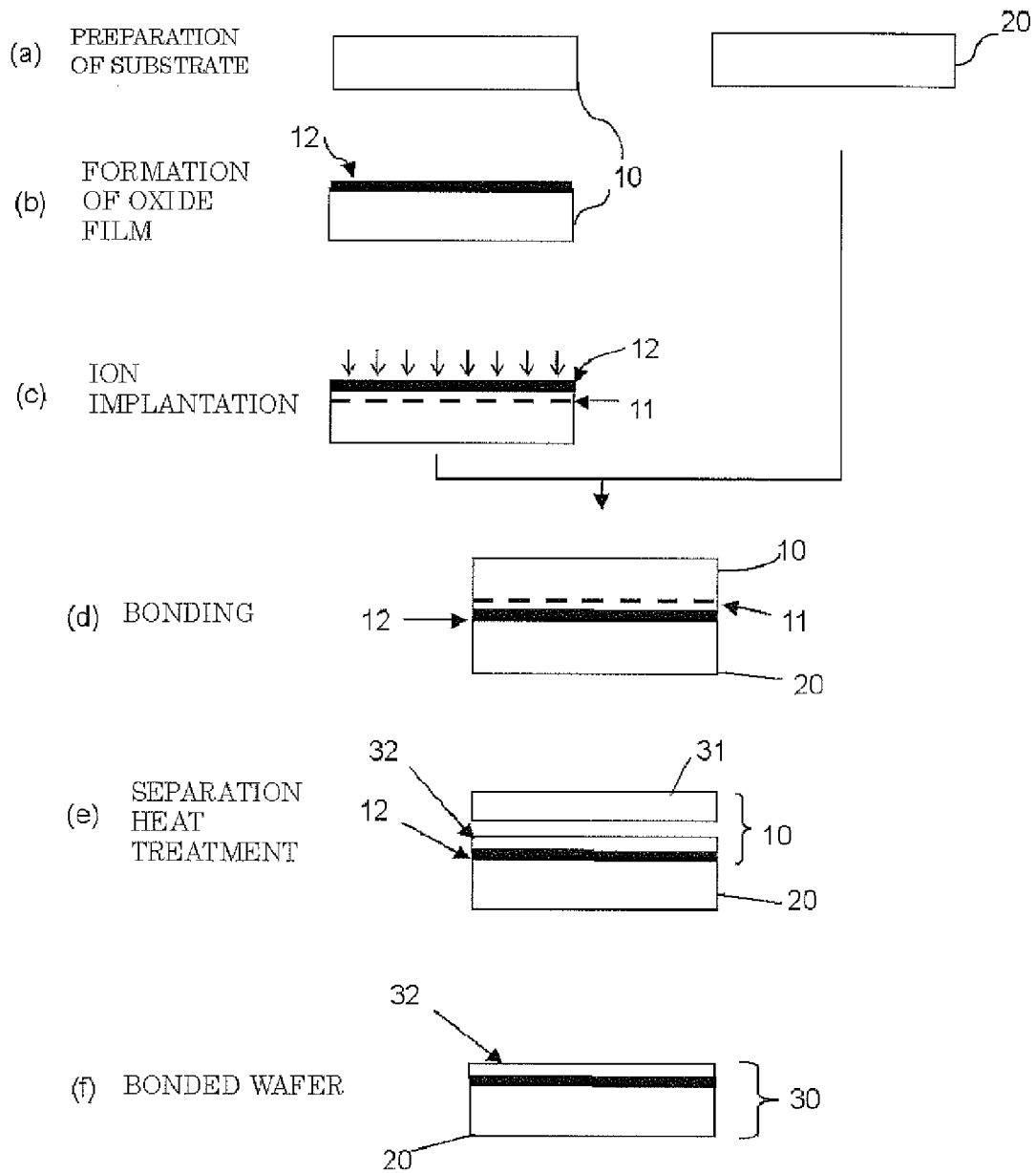
FIG. 1 is a flowchart showing an embodiment of a method of producing a bonded wafer according to the invention.

In step (a) in FIG. 1, a bond wafer 10 and a base wafer 20 are first prepared. These wafers have a cutout portion. Mirror-polished silicon single crystal wafer, for example, can be preferably used as the bond wafer 10 and base wafer 20.

The cutout portion shows the plane orientation of the wafer surface in a rotation direction, and can thereby be used as a positional reference in the bonding process. Although this cutout portion may be a notch or orientation flat, the notch is mainly used in recent wafers having a large diameter and hence preferable.

In next step (b), at least one of the bond wafer 10 and base wafer 20, the bond wafer 10 in this embodiment, is subjected to thermal oxidation to form an oxide film 12 having, for example, about 100 nm to 2,000 nm on its surface. An oxide film may be formed on the surface of the base wafer 20 or both the wafers. There is a case in which no oxide film is formed on both the wafers.

In next step (c), at least one of hydrogen ions and rare gas ions, hydrogen ions in this embodiment, are implanted into the bond wafer 10 from a surface of the bond wafer 10 to form a layer 11 of the implanted ions (a micro bubble layer) that is parallel to the wafer surface at an average penetration depth of the ions.

In the ion implantation process in the invention, either or both of settings of an ion implanter and conditions of the ion implantation are adjusted to control the separation start position of the bond wafer in the separation process, as described below. A method of controlling the separation start position so as to be the desired position by the settings of the ion implanter and conditions of the ion implantation will now be described in detail.

The ion implantation separation method can form a semiconductor thin film on the base wafer, for example, by exclusively implanting hydrogen ions into the bond wafer, bonding the bond wafer and a support wafer, i.e., the base wafer, and then performing the separation heat treatment. In other words, the separation of the wafer is brought about by providing heat energy to the high hydrogen concentration layer. Compared with a portion at which the damage is comparatively small, a portion at which the damage is large has been implanted the ions in a larger amount or subjected to a heavier heat load in the implantation process, and is hence easier to separate. The edge of the wafer is easy to separate because of being a free end. Because a central portion of the wafer, in contrast, has no free end and is restrained by its peripheral portion, this portion is hard to separate. Accordingly, the separation is likely to begin at the wafer edge having a comparatively heavily damaged portion.

The separation start position can therefore match the position of the cutout portion or the position of 180° away from the cutout portion under the following condition: the bond wafer is arranged in the ion implanter in the ion implantation process such that the position of the cutout portion of the bond wafer or the position of 180° away from the cutout portion of the bond wafer matches the position at which the damage due to the ion implantation, which is determined by the ion implanter and the conditions of the ion implantation, is comparatively large in the plane of the bond wafer. In the ion implanter, the direction of the notch in the ion implantation can be freely determined and it is easy to locate the notch at the position of a high damage distribution in the ion implantation.

Therma Wave method is usually used to measure the degree of damage due to the ion implantation (See Japanese Unexamined Patent publication No. S61-223543). This Therma Wave method is non-contact measurement of the amount of implanted ions without performing a heat treatment on an object into which the ions are implanted. In the Therma Wave method, this object is irradiated with laser light for detection (detection light), the measurement point is irradiated with another laser light for excitation (excitation light), and variations in reflected light of the detection light are measured. When the ion-implanted semiconductor is irradiated with excitation light having an energy equal to or larger than the band cap of the semiconductor, a photo excited carrier that acts as a free carrier is generated at the irradiated portion, and the reflectance of the light varies depending on the generation of the photo excited carrier and the disappearance due to recombination. The conditions of this generation and disappearance of the photo excited carrier, i.e., the variation in the reflectance of the light, is related to the degree of the damage of a surface layer of the semiconductor. The Therma Wave method can measure the degree of the damage by optically measuring the variation in the reflectance of the light in the surface layer of the semiconductor.

The distribution of the amount of the implantation can be presumed instead of measuring the degree of the damage due to the ion implantation by the Therma Wave method. The distribution of the amount of the implantation is greatly affected by heat distribution during the implantation. This is determined by the conditions of contact between the wafer and the heat sink: good contact improves cooling ability, thereby decreasing the temperature during the implantation; on the contrary, bad contact impairs cooling ability, thereby increasing the temperature during the implantation. The conditions of contact of the wafer back surface can be checked from a particle map of the wafer back surface. It can be presumed that a larger amount of particles means good contact and high cooling ability, and a smaller amount of particles means bad contact and low cooling ability. The cooling conditions of the entire wafer can be presumed by the combination between the map and the position of a pin of a wafer holder.

These method are used to specify the position at which the damage due to the ion implantation is comparatively large in the plane of the bond wafer and the settings of the ion implanter and the ion implantation conditions at that time. This position can match the separation start position under the following conditions: the bond wafer is arranged in the ion implanter such that the position of the cutout portion of the bond wafer or the position of 180° away from the cutout portion of the bond wafer matches the position at which the damage due to the ion implantation is comparatively large in the plane of the bond wafer.

Figure 2:
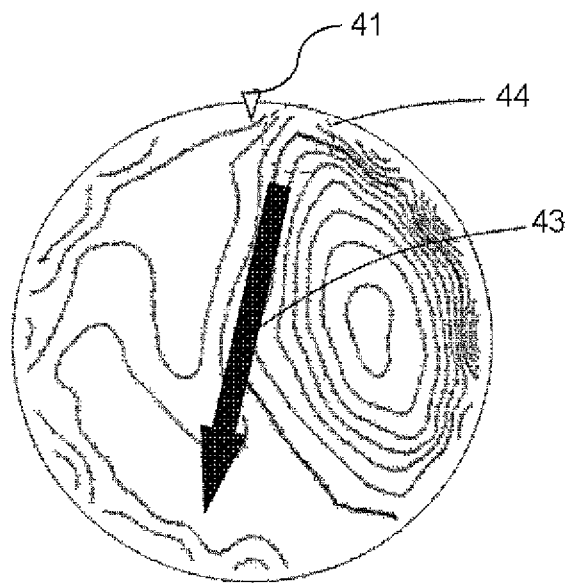
FIG. 2 is a schematic diagram of example 1 in which a notch was located at a position at which damage due to ion implantation was comparatively large in a plane of the bond wafer.

FIG. 2 schematically shows an example in which a notch is located at the position at which the damage due to ion implantation is comparatively large in the plane of the bond wafer. When the notch 41 is located at the position 44 of the heavily damaged portion, the position of the notch can match the separation start position. The separation proceeds in the separation direction 43 during the separation heat treatment. The involvement of the notch with the separation in its course can be avoided.

Moreover, paying attention to the distribution of the amount of implanted ions on the wafer surface, a larger amount of implanted ions facilitates the separation and allows the separation to proceed by a heat treatment for a short time, as described above. When a portion at which the amount of implanted ions is comparatively large is produced at the wafer edge, the separation begins at portion at which the amount of implanted ions is comparatively large. That is, the separation start position can match the position of the cutout portion of the bond wafer or the position of 180° away from the cutout portion of the bond wafer under the condition that the amount of implanted ions at the position of the cutout portion of the bond wafer or the position of 180° away from the cutout portion of the bond wafer is larger than at the other positions in the ion implantation.

An ion implanter is usually used to implant ions uniformly into the plane of a wafer. Figuring out an action of scanning a wafer or beam allows the amount of the implantation to be locally increased.

Figure 5:
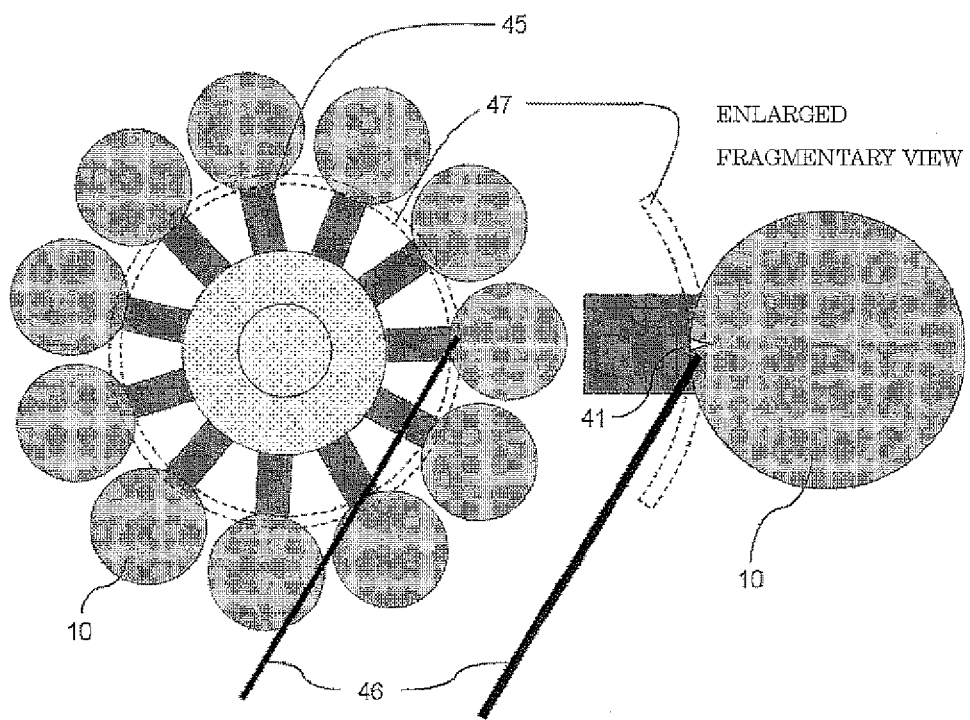
FIG. 5 is a schematic diagram of example 3 in which the amount of implanted ions at a notch portion was increased with a batch type of ion implanter.

FIG. 5 schematically shows an example in which the amount of implanted ions at the notch portion is increased with a batch type of ion implanter. An exemplary ion implanter of this batch type places the bond wafer 10 on a body 45 of revolution such that the notch 41 faces the inside or outside of a wheel and scans the bond wafer 10 by an ion beam 46 in the lateral direction along a trajectory 47 of bean scan. At this time, this ion implanter can increase the amount of the implantation at the notch portion comparatively by decreasing a scanning speed at the position of the notch 41 or scanning only the edge of the wafer. The center of scanning away from the center of the wafer permits an increase or decrease in the amount of the implantation to be distributed in the scanning direction.

Accordingly, when the notch is located at the position at which the amount of the implantation is large, the amount of the implantation into the notch portion can be increased.

Figure 6:
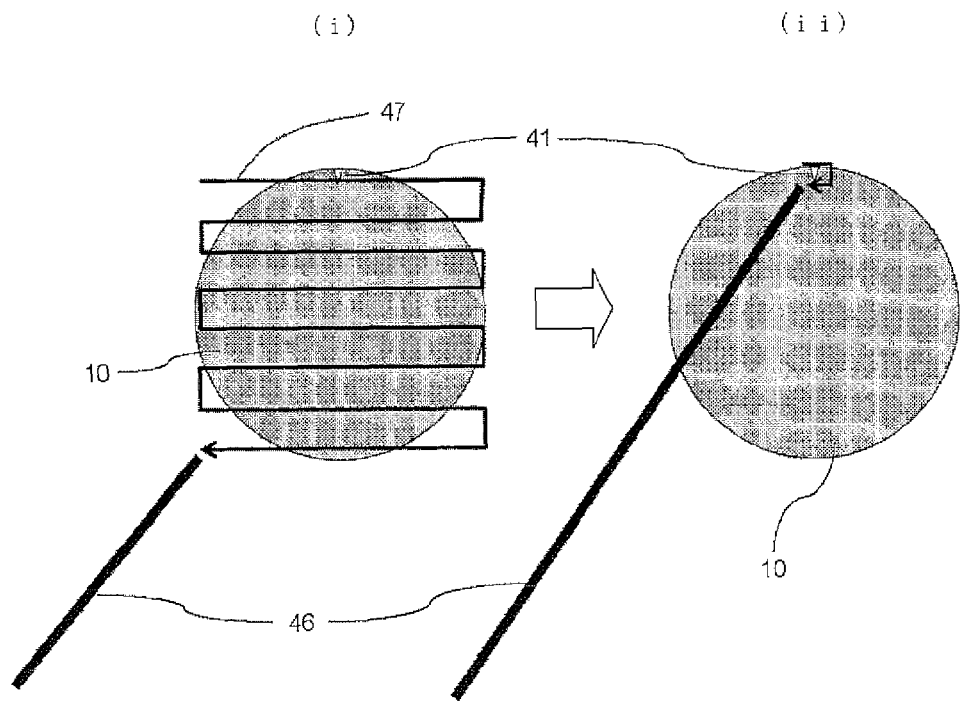
FIG. 6 is a schematic diagram of example 4 in which the amount of implanted ions into a notch portion was increased in a manner that (i) the ions were implanted with a single-wafer-processing type of ion implanter over the entire surface of a wafer and (ii) additional ions were then implanted at the notch portion.

FIG. 6 schematically shows an example in which the amount of implanted ions into the notch portion is increased with a single-wafer-processing type of ion implanter. An exemplary ion implanter of this single-wafer-processing type scans the entire surface of the bond wafer 10 by the ion beam 46 along the trajectory 47 of bean scan as shown in (i), and then emits a large amount of ion beam 46 to the notch 41 to implant additional ions. In this way, this ion implanter can increase the amount of the implantation into the notch portion.

Increasing the amount of the implantation into the notch portion, for example, in the above manner allows the separation start position to match the position of the notch portion. When the same operation is carried out at the position of 180° away from the notch portion, the separation start position can match the position of 180° away from the notch portion.

Moreover, paying attention to the temperature of the wafer during the implantation, the temperature in the plane of the wafer can be determined by contact between the wafer and the heat sink and between the wafer and a wafer holder such as a pin. A heat sink rubber, an intermediate material, is provided between the wafer and the heat sink to improve the contact between the wafer and the heat sink. Adjustment of the contact and thermal conductivity of this heat sink rubber such that cooling efficiency of the notch portion is reduced permits the separation start position to match the position of the notch portion. That is, this position can match the separation start position under the condition that the position of the cutout portion of the bond wafer or the position of 180° away from the cutout portion of the bond wafer matches the position at which thermal conduction of the heat sink when the ions are implanted is comparatively poor in the plane of the bond wafer.

Figure 7:
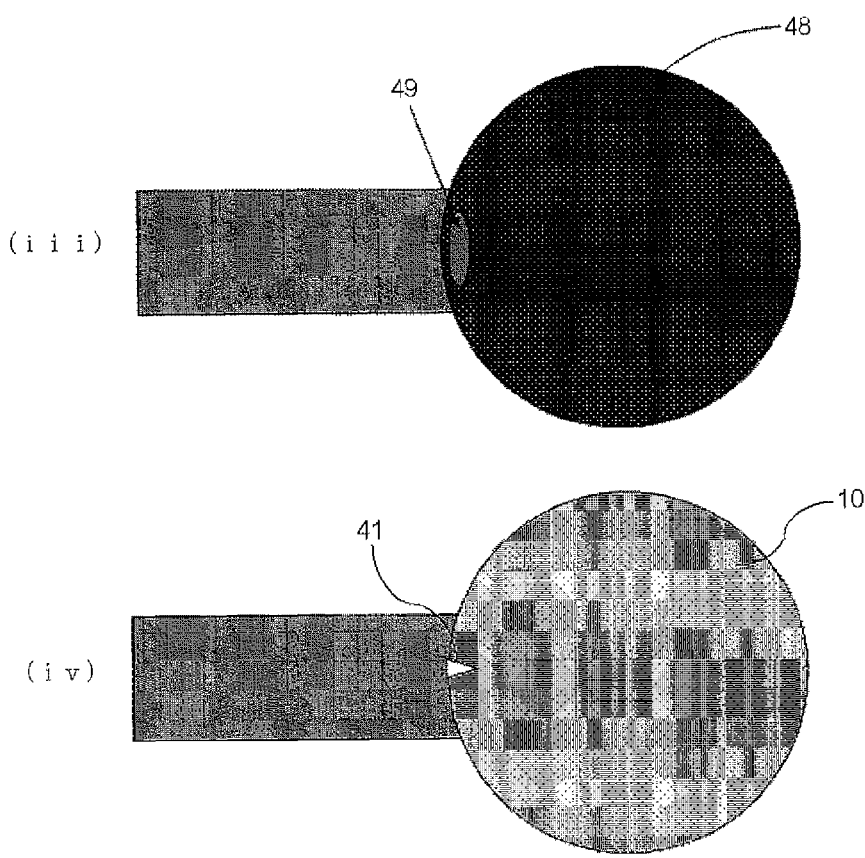
FIG. 7 is a schematic diagram of example 5 in which (iii) heat sink rubber having a local portion of low carbon concentration was used and (iv) a wafer was arranged such that a notch was located at the position of the low carbon concentration.

An exemplary method of decreasing the thermal conduction of the heat sink is to decrease the thermal conduction of the heat sink rubber itself. For example, when the thermal conductivity of the heat sink rubber is changed by adding additives such as carbon and alumina to the rubber, a local variation in the amount of added carbon, for example, permits a reduction in cooling efficiency. FIG. 7 schematically shows an example in which a heat sink having a locally lowered carbon concentration is used. As shown in FIG. 7, (iii) a portion 49 having a lower carbon concentration is produced in part of the heat sink 48, and (iv) a wafer 10 is arranged such that the notch 41 is located at this portion. This enables the damage due to ion implantation at the notch to be increased.

In addition, roughening the surface of the heat sink rubber decreases a contact area between the heat sink rubber and the wafer and thereby allows the cooling efficiency to be locally reduced. When the heat sink rubber has special surface irregularities, decreasing the contact area of the wafer allows the cooling efficiency to be locally reduced. When a recess is formed on a base of the heat sink to locally make the flatness of the base worse at the position at which the cooling efficiency needs to be reduced, the contact area of the wafer back surface is decreased, so the cooling efficiency of the wafer can be reduced.

Moreover, thickening part of the heat sink rubber decreases thermal conduction at that part, resulting in a reduction in the cooling efficiency of the wafer.

These methods permit the heat sink to have a portion at which the thermal conduction is comparatively poor in the plane of the bond wafer. This portion can match the separation start position under the condition that the portion having a thus reduced cooling efficiency matches the position of the cutout portion of the bond wafer or 180° away from the cutout portion of the bond wafer.

Adjusting either or both of settings of the ion implanter and the ion implantation conditions allows the separation start position to match a desired position by intention.

In next step (d), the surface from which the ions have been implanted into the bond wafer 10 and a surface of the base wafer 10 are superposed through the oxide film 12 to bond these wafers. These wafers are bonded without an adhesive by bringing the surface of these two wafers into contact with one another under a clean atmosphere at room temperature.

In this step, the bond wafer 10 and the base wafer 20 are preferably bonded such that both of the cutout portions are located at the same position. These wafers however can be bonded such that their cutout portions are located at different positions.

In this case, when the difference in angle between these positions is 30° or less, their cutout portions are preferably located at within 0±30° or 180±30° away from the separation start position. When the difference in angle between these positions is greater than 30°, the wafer that is more likely to generate the large fault defect is preferably located such that its cutout portion is located at within 0±30° or 180±30° away from the separation start position. Which cutout portion more greatly affects the occurrence of the large fault defect cannot be qualitatively identified, but can be statistically grasped through experiments under fixed production conditions.

In next step (e), i.e. separation process, the wafers are separated along the layer 11 of the implanted ions into a separated wafer 31 and a bonded wafer 30 having an SOI layer 32 disposed on the oxide film 12 on the base wafer 20. Performing a heat treatment at about 500° C. or higher under an inert gas atmosphere, for example, causes the wafers to be separated into the separated wafer 31 and the bonded wafer 30 (having the SOI layer 32, oxide film 12, and base wafer 20) by rearrangement of crystals and agglomeration of bubbles.

The invention can avoid the involvement of the cutout portion in the course of the separation during the separation process and inhibit the occurrence of the large fault defeat under the condition that the cutout portion of either or both of the bond wafer and the base wafer after the bonding step is located at within the range of 0±30° or 180±30° from the separation start position in the separation process.

The cutout portion of either or both of the bond wafer and the base wafer after the bonding step is preferably located at within the range of 0±20° or 180±20° from the separation start position, more preferably within the range of 0±10° or 180±10° from the separation start position.

When the damage due to the implantation is uniformly distributed, the separation is easy to proceed at the position at which the temperature in a heat treatment furnace is high. The temperature in the heat treatment furnace is not perfectly uniformly distributed, but may be distributed, for example, such that the temperature on the upper side of the furnace is comparatively high. Accordingly, the wafers are arranged in the heat treatment furnace such that the position of the cutout portion or the position of 180° away from the cutout portion of either or both of the bond wafer and the base wafer matches the position at which the wafers after the bonding step have a comparatively high temperature in their plane. This arrangement more reliably enables this position to match the separation start position.

Figure 4:
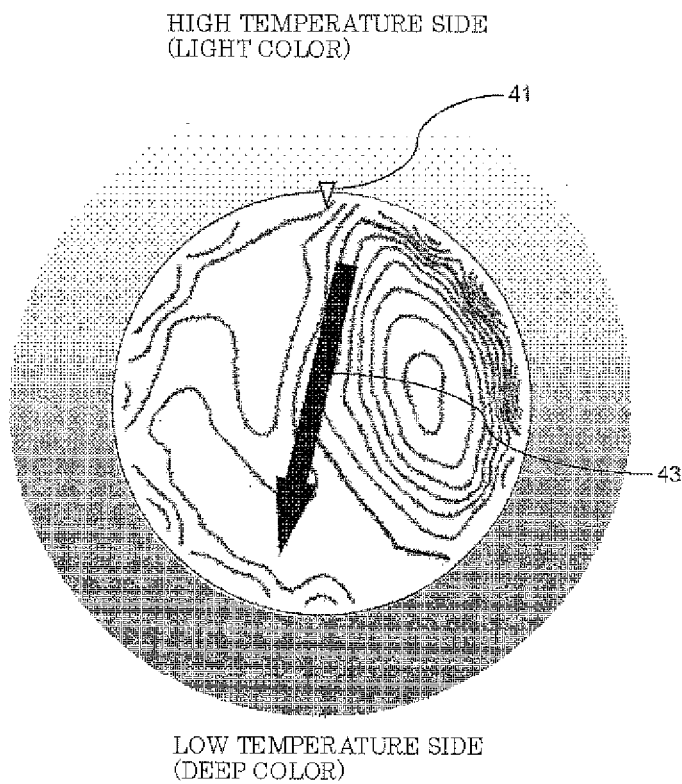
FIG. 4 is a schematic diagram of example 2 in which a notch was located at a position at which the temperature in a heat treatment furnace was in a high range and a separation heat treatment was performed.

FIG. 4 schematically shows an exemplary separation heat treatment in which the notch is located at a position at which the temperature in the heat treatment furnace is in a high range. A shade of color shown outside a wafer in FIG. 4 represent the temperature distribution in the heat treatment furnace. A light color represents a high temperature range, and a deep color represents a low temperature range. As shown in FIG. 4, arranging the notch 41 so as to have a high temperature in the separation heat treatment more reliably enables the position of the notch to match the separation start position. In this separation heat treatment, the separation proceeds in the separation direction 43, so the separation can be prevented from being affected by the notch halfway.

The temperature distribution in the heat treatment furnace can be checked by a thermocouple, thermal oxidation, or sheet resistance distribution.

In addition to the temperature distribution in the heat treatment furnace, temperature distribution can be created by adjusting the power balance of a heater of the heat treatment furnace.

The heat treatment furnace for the separation is preferably a horizontal furnace. The horizontal furnace permits the separation start position of the bond wafer to be comparatively constant in each furnace and enables the invention to be more reliably carried out.

Thus, the inventive method of producing a bonded wafer enables intentional adjustment of the separation start position when the ions are implanted into the bond wafer. Accordingly, the invention can avoid the involvement of the cutout portion in the course of the separation during the separation process and inhibit the occurrence of the large fault defect under the condition that the cutout portion of either or both of the bond wafer and the base wafer after the bonding step is located at within the range of 0±30° or 180±30° from the separation start position.

EXAMPLE

The present invention will be described below with reference to examples and comparative examples, but the invention is not limited to these examples.

Example 1

Example in which the Notch was Located at the Position of a Portion Heavily Damaged Due to Ion Implantation (Bond Wafer)
A thermal oxide film having a thickness of 200 nm was formed on a bond wafer made of a 300-mm diameter silicon single crystal having a notch orientation of <011> and a crystal orientation of <100>. Then, ions were implanted into this wafer at 60 keV in a dose amount of $7 \times 10^{16}/cm^2$ such that the distribution of the dose amount was uniform in a plane.

To find the position of the most heavily damaged portion at the edge of a wafer into which ions were implanted under the above ion implantation conditions, damage distribution (in-plane map) of this wafer was measured with Therma Wave (made by KLA-Tencor) in advance. Another wafer was arranged in the ion implanter such that this portion matched its notch portion and the ions were implanted. The resultant wafer was used as the bond wafer in example 1 (See FIG. 2).

(Base Wafer)
A base wafer made of a 300-mm diameter silicon single crystal having a notch orientation of <011> and a crystal orientation of <100> was prepared.

(Bonding)
The bond wafer and the base wafer were bonded at room temperature so as to match the position of their notches.

(Separation Heat Treatment)
The separation heat treatment was performed under the conditions of 500° C., 30 minutes, 100% argon atmosphere, and a horizontal furnace such that the temperature distribution was uniform in a plane (500±1° C.)

(Observation of Large Fault Defect)
The bonded wafer after the separation was visually observed under condensed light to investigate how many wafers generated the large fault defect. The result was that the incidence of the large fault defect was 1% (2/200 pieces) in example 1.

Comparative Example 1

Figure 3:
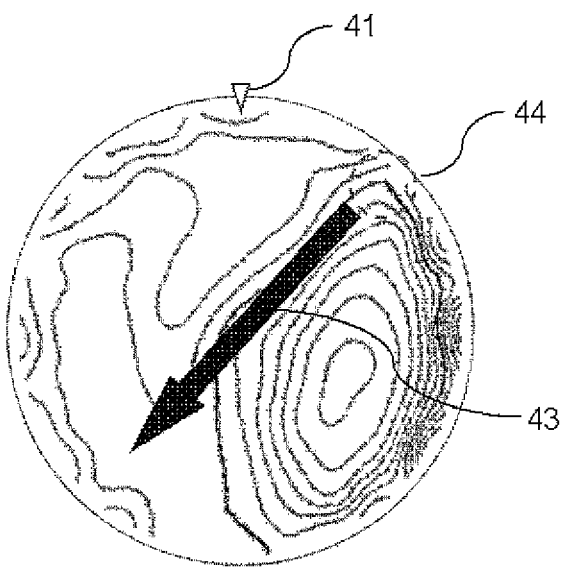
FIG. 3 is a schematic diagram of comparative example 2 in which a notch was not located at a position at which damage due to ion implantation was comparatively large in a plane of the bond wafer.

Example in which the Notch was not Located at the Position of a Portion Heavily Damaged Due to Ion Implantation The position of the most heavily damaged portion at the edge of a wafer was found in the same manner as example 1. A wafer was arranged in the ion implanter such that a portion of 45° away from the notch portion was most heavily damaged. Ions were implanted into this wafer under the same conditions as example 1. The resultant wafer was used as the bond wafer in comparative example 1 (See FIG. 3).

The same base wafer as example 1 was prepared and subjected to the bonding and separation heat treatment in the same manner as example 1.

The bonded wafer after the separation was visually observed under condensed light to investigate how many wafers generated the large fault defect. The result was that the incidence of the large fault defect was 30% (60/200 pieces) in comparative example 1.

Example 2

Example in which the Notch was Located at a High Temperature Region in the Heat Treatment Furnace The same bond and base wafers as example 1 were prepared.

(Bonding)
The bond wafer and the base wafer were bonded at room temperature so as to match the position of their notches.

(Separation Heat Treatment)
In example 2, the separation heat treatment was performed under the conditions of 500° C., 30 minutes, 100% argon atmosphere, and a horizontal furnace such that the notch was located at a high temperature portion in heat treatment furnace having temperature distribution in which an upper portion of the furnace had a temperature 5° C. higher than other portions (See FIG. 4).

(Observation of Large Fault Defect)

The bonded wafer after the separation was visually observed under condensed light to investigate how many wafers generated the large fault defect. The result was that the incidence of the large fault defect was 0.5% (1/200 pieces) in example 2.

Example 3 and Example 4

Example in which the Amount of Implanted Ions into the Notch Portion was Increased (Bond Wafer)

A thermal oxide film having a thickness of 200 nm was formed on a bond wafer made of a 300-mm diameter silicon single crystal having a notch orientation of <011> and a crystal orientation of <100>. Then, in example 3, ions were implanted into the wafer at 60 keV in a dose amount of $7 \times 10^{16}/cm^2$ with a batch type of ion implanter such that the distribution of the dose amount was uniform in a plane, and 2% of addition ions were implanted into the vicinity (from the edge to 1 cm away from the edge) of the notch portion. The resultant wafer was used as the bond wafer in example 3 (See FIG. 5). In example 4, after forming a thermal oxide film, ions were implanted into the wafer at 60 keV in a dose amount of $7 \times 10^{16}/cm^2$ with a single-wafer-processing type of ion implanter such that the distribution of the dose amount was uniform in a plane, and 2% of addition ions were implanted into the vicinity (2 cm$^2$) of the notch portion. The resultant wafer was used as the bond wafer in example 4 (See FIG. 6).

(Base Wafer)

A base wafer made of a 300-mm diameter silicon single crystal having a notch orientation of <011> and a crystal orientation of <100> was prepared.

(Bonding)

The bond wafer and the base wafer were bonded at room temperature so as to match the position of their notches.

(Separation Heat Treatment)

The separation heat treatment was performed under the conditions of 500° C., 30 minutes, 100% argon atmosphere, and a horizontal furnace such that the temperature distribution was uniform in a plane (500±1° C.)

(Observation of Large Fault Defect)

The bonded wafer after the separation was visually observed under condensed light to investigate how many wafers generated the large fault defect. The result was that the incidence of the large fault defect was 1% (2/200 pieces) in example 3 and 1% (2/200 pieces) in example 4.

Example 5

Example in which the Notch Portion was Located at the Position at which Thermal Conduction of the Heat Sink was Comparatively Poor when Ions were Implanted (Bond Wafer)

A thermal oxide film having a thickness of 200 nm was formed on a bond wafer made of a 300-mm diameter silicon single crystal having a notch orientation of <011> and a crystal orientation of <100>. Then, ions were implanted into this wafer at 60 keV in a dose amount of $7 \times 10^{16}/cm^2$ such that the distribution of the dose amount was uniform in a plane. The heat sink rubber of the heat sink, on which the bond wafer was placed, was doped with carbon such that a local portion (having an area of 2 cm$^2$) had a carbon concentration 10% lower than other portions. In the ion implantation, this heat sink rubber was used to reduce the thermal conductivity of the heat sink. The ions were implanted under the condition that the notch was located at the local portion of the heat sink that had a carbon concentration 10% lower. The resultant wafer was used as the bond wafer in example 5 (See FIG. 7).

(Base Wafer)

A base wafer made of a 300-mm diameter silicon single crystal having a notch orientation of <011> and a crystal orientation of <100> was prepared.

(Bonding)

The bond wafer and the base wafer were bonded at room temperature so as to match the position of their notches.

(Separation Heat Treatment)

The separation heat treatment was performed under the conditions of 500° C., 30 minutes, 100% argon atmosphere, and a horizontal furnace such that the temperature distribution was uniform in a plane (500±1° C.).

(Observation of Large Fault Defect)

The bonded wafer after the separation was visually observed under condensed light to investigate how many wafers generated the large fault defect. The result was that the incidence of the large fault defect was 0.5% (1/200 pieces) in example 5.

Comparative Example 2

Figure 8:
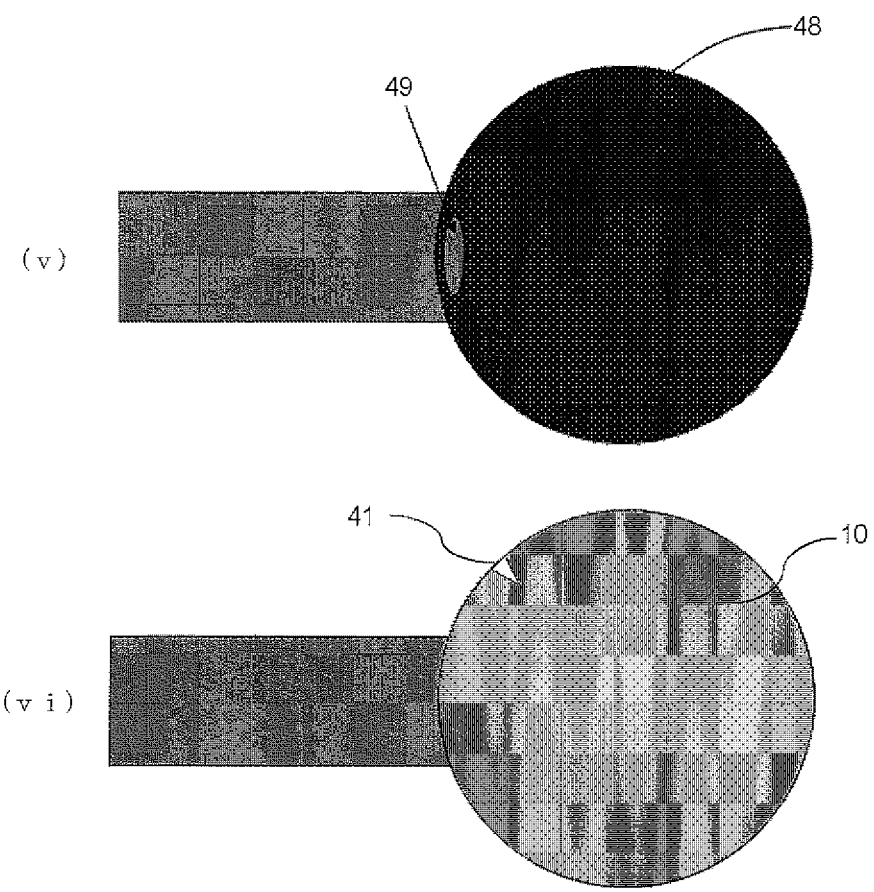
FIG. 8 is a schematic diagram of comparative example 2 in which (v) heat sink rubber having a local portion of low carbon concentration was used and (vi) a wafer was arranged such that a notch was not located at the position of the low carbon concentration.

Example in which the Notch Portion was not Located at the Position at which Thermal Conduction of the Heat Sink was Comparatively Poor when Ions were Implanted The same heat sink having a locally reduced thermal conductivity as example 5 was used. The ions were implanted under the same condition as example 5 except that the notch was located at 45° away from the local portion of the heat sink that had a carbon concentration 10% lower (See FIG. 8).

The same base wafer as example 5 was prepared and subjected to the bonding and separation heat treatment in the same manner as example 5.

The bonded wafer after the separation was visually observed under condensed light to investigate how many wafers generated the large fault defect. The result was that the incidence of the large fault defect was 27% (54/200 pieces) in comparative example 2.

Comparative examples 1 and 2 in which the notch was involved with the separation halfway exhibited an incidence of large fault defect of 27% or higher. Examples 1 to 5 in which the notch was located at the separation start position, in contrast, the notch was not involved with the separation halfway, and the incidence of the large fault defect was 3% or less.

The separation heat treatment was then performed multiple times under different conditions: the difference in position of the notch of the wafers after the bonding and the separation start position was changed to 0°, 10°, 20°, 30°, 45°, 90°, 135°, 150°, and 180°. Table 1 below shows the incidence of the large fault defect in each bonded wafer.

TABLE 1

| ANGULAR DIFFERENCE FROM SEPARATION START POSITION TO NOTCH (degree) | | | | | | | | |
|---|---|---|---|---|---|---|---|---|
| 0 | 10 | 20 | 30 | 45 | 90 | 135 | 150 | 180 |
| INCIDENCE OF LARGE FAULT DEFECT (%) | | | | | | | | |
| 1 | 2 | 3 | 5 | 30 | 56 | 38 | 4 | 1 |

As shown in Table 1, arranging the notch so as to locate at within the range of 0±30° or 180±30° from the separation start position reduced the incidence of the large fault defect.

This result revealed the fact that the inventive method of producing a bonded wafer enables a reduction in the incidence of large fault defect, which may be generated when the separation process is performed by the ion implantation separation method.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of producing a bonded wafer, comprising:
implanting hydrogen ions, rare gas ions, or mixed gas ions thereof into a bond wafer from a surface of the bond wafer to form a layer of the implanted ions in an interior of the bond wafer;
bonding the surface from which the ions are implanted into the bond wafer and a surface of a base wafer; and then
separating the bond wafer along the layer of the implanted ions by performing a separation heat treatment on the wafers after the bonding step by using a heat treatment furnace such that the bonded wafer is formed, wherein
wafers each having a cutout portion are used as the bond wafer and the base wafer, and
either or both of settings of an ion implanter with which the ions are implanted and conditions of the ion implantation are adjusted in the step of implanting the ions such that the cutout portion of either or both of the bond wafer and the base wafer after the bonding step is located at within a range of 0±30° or 180±30° from a position at which the separation of the bond wafer begins in the step of separating the bond wafer.

2. The method according to claim 1, wherein the step of implanting the ions includes arranging the bond wafer in the ion implanter such that a position of the cutout portion of the bond wafer or a position of 180° away from the cutout portion of the bond wafer matches a position at which damage due to the ion implantation is comparatively large in a plane of the bond wafer, the damage being determined by the ion implanter and the conditions of the ion implantation.

3. The method according to claim 1, wherein in the step of implanting the ions, an amount of the implanted ions at a position of the cutout portion of the bond wafer or a position of 180° away from the cutout portion of the bond wafer is larger than at other positions.

4. The method according to claim 2, wherein in the step of implanting the ions, an amount of the implanted ions at the position of the cutout portion of the bond wafer or the position of 180° away from the cutout portion of the bond wafer is larger than at other positions.

5. The method according to claim 1, wherein the step of implanting the ions includes arranging the bond wafer on a heat sink such that a position of the cutout portion of the bond wafer or a position of 180° away from the cutout portion of the bond wafer matches a position at which thermal conduction of the heat sink when the ions are implanted is comparatively poor in a plane of the bond wafer.

6. The method according to claim 2, wherein the step of implanting the ions includes arranging the bond wafer on a heat sink such that the position of the cutout portion of the bond wafer or the position of 180° away from the cutout portion of the bond wafer matches a position at which thermal conduction of the heat sink when the ions are implanted is comparatively poor in a plane of the bond wafer.

7. The method according to claim 3, wherein the step of implanting the ions includes arranging the bond wafer on a heat sink such that the position of the cutout portion of the bond wafer or the position of 180° away from the cutout portion of the bond wafer matches a position at which thermal conduction of the heat sink when the ions are implanted is comparatively poor in a plane of the bond wafer.

8. The method according to claim 4, wherein the step of implanting the ions includes arranging the bond wafer on a heat sink such that the position of the cutout portion of the bond wafer or the position of 180° away from the cutout portion of the bond wafer matches a position at which thermal conduction of the heat sink when the ions are implanted is comparatively poor in a plane of the bond wafer.

9. The method according to claim 5, wherein a portion of the heat sink at the position at which the thermal conduction of the heat sink is comparatively poor in a plane of the bond wafer is made of a material having a lower thermal conductivity than at other portions.

10. The method according to claim 6, wherein a portion of the heat sink at the position at which the thermal conduction of the heat sink is comparatively poor in a plane of the bond wafer is made of a material having a lower thermal conductivity than at other portions.

11. The method according to claim 7, wherein a portion of the heat sink at the position at which the thermal conduction of the heat sink is comparatively poor in a plane of the bond wafer is made of a material having a lower thermal conductivity than at other portions.

12. The method according to claim 8, wherein a portion of the heat sink at the position at which the thermal conduction of the heat sink is comparatively poor in a plane of the bond wafer is made of a material having a lower thermal conductivity than at other portions.

13. The method according to claim 5, wherein a portion of the heat sink at the position at which the thermal conduction of the heat sink is comparatively poor in a plane of the bond wafer is thicker than the other portions.

14. The method according to claim 9, wherein the portion of the heat sink at the position at which the thermal conduction of the heat sink is comparatively poor in a plane of the bond wafer is thicker than the other portions.

15. The method according to claim 1, wherein the step of performing the separation heat treatment includes arranging the wafers after the bonding step in the heat treatment furnace such that a position of the cutout portion or a position of 180° away from the cutout portion of either or both of the bond wafer and the base wafer matches a position at which the wafers after the bonding step have a comparatively high temperature in their plane.

16. The method according to claim 2, wherein the step of performing the separation heat treatment includes arranging the wafers after the bonding step in the heat treatment furnace such that the position of the cutout portion or the position of 180° away from the cutout portion of either or both of the bond wafer and the base wafer matches a position at which the wafers after the bonding step have a comparatively high temperature in their plane.

17. The method according to claim 3, wherein the step of performing the separation heat treatment includes arranging the wafers after the bonding step in the heat treatment furnace such that the position of the cutout portion or the position of 180° away from the cutout portion of either or both of the bond wafer and the base wafer matches a position at which the wafers after the bonding step have a comparatively high temperature in their plane.

18. The method according to claim 5, wherein the step of performing the separation heat treatment includes arranging the wafers after the bonding step in the heat treatment furnace such that the position of the cutout portion or the position of 180° away from the cutout portion of either or both of the bond wafer and the base wafer matches a position at which the wafers after the bonding step have a comparatively high temperature in their plane.

19. The method according to claim 9, wherein the step of performing the separation heat treatment includes arranging the wafers after the bonding step in the heat treatment furnace such that the position of the cutout portion or the position of 180° away from the cutout portion of either or both of the bond wafer and the base wafer matches a position at which the wafers after the bonding step have a comparatively high temperature in their plane.

20. The method according to claim 1, wherein the cutout portion is a notch.

* * * * *